United States Patent [19]

Andros et al.

[11] 4,212,349
[45] Jul. 15, 1980

[54] MICRO BELLOWS THERMO CAPSULE

[75] Inventors: Frank E. Andros, Binghamton; Robert J. E. Shay, Bath, both of N.Y.

[73] Assignee: International Business Machines Corporation, Armonk, N.Y.

[21] Appl. No.: 48

[22] Filed: Jan. 2, 1979

[51] Int. Cl.$^2$ ............................................ F28D 15/00
[52] U.S. Cl. ............................. 165/105; 174/15 HP; 357/82
[58] Field of Search .................... 165/105; 174/15 HP; 357/82

[56] References Cited

U.S. PATENT DOCUMENTS 3,673,306  6/1972  Kirkpatrick .................... 165/105 X Primary Examiner—Albert W. Davis
Attorney, Agent, or Firm—Gerald R. Gugger

[57] ABSTRACT

A closed two phase liquid-vapor heat transfer device is provided which is independent of orientation and requires no wick. A micro bellows containment vessel is filled with liquid to form a coolant vapor phase bubble which is centered within the vessel due to the surface energy characteristics of the fluid. Heat input at the evaporator section results in evaporation of the liquid at the liquid-vapor interface. The vapor flows across the bubble and condenses on the opposite side where heat is rejected and liquid is replenished to the evaporator section by flow through the continuous liquid film.

9 Claims, 7 Drawing Figures

MICRO BELLOWS THERMO CAPSULE

BACKGROUND OF THE INVENTION

In the present day integrated circuit technology, metallized ceramic modules are provided which are pluggable into printed circuit cards and boards. These modules take the form of a ceramic substrate base having a printed circuit pattern on a surface thereof to which is solder bonded one or more silicon chips. A module cap or cover is employed to provide a hermetic seal. These chips have embedded therein circuits, such as memory driver and sense circuits, operational amplifiers and support logic for these circuits. The circuit chips perform the special electronic functions for the machines they are used with and the chips produce large quantities of heat during their operation and the problem of adequately dissipating this heat is of major concern.

It has been well known to provide heat transfer means or heat sinks for integrated circuit modules. Such means have taken the form, for example, of piston contact between the chip device and a suitable cold plate; the use of cooling fins; the use of an air stream or conductors of liquid coolant; and filling the gap between the chip device and the module cap with a thermal grease or conductive powder or liquid metal.

The aforementioned heat transfer means usually occupy a large amount of space and employ rather critical material. Also, they are relatively expensive to manufacture and are large and heavy in use.

More recently, two relatively new techniques have been involved in the cooling of circuit elements which employ the principles of a thermosiphon and a heat pipe. In the thermosiphon, a container is provided with liquid coolant in an evaporator section and heat input to this section results in vapor which condenses in a condenser section where heat is rejected. The siphon relies on external forces, such as gravity, to return the condensate vertically along the side walls to the evaporator section. The heat pipe also employs a container having liquid coolant in an evaporator section and heat input to this section results in vapor which condenses in a condenser section where heat is rejected. The heat pipe uses the capillary forces of an internal wick structure to recirculate condensate to the evaporator section. The thermosiphon is limited in its orientation which is dependent on the external forces used to provide continuous condensate recirculation. The heat pipe is a relatively expensive heat transfer device due to the cost of the internal wick structure and this is particularly true where a flexible bellows type container is used. A flexible bellows type heat transfer device is preferred for integrated circuit module applications because it provides a secondary heat transfer path which should be flexible in order to minimize the force exerted on the chip and solder joints which arise due to tolerance buildup on the chip, substrate, and cap assembly. It became evident that the desirable heat transfer device would be one of the bellows type which would be independent of external forces and which does not require a wicking mechanism for continuous operation.

SUMMARY OF THE INVENTION

The present invention provides a micro bellows thermo capsule which is unique in that its continuous operation is independent of external forces and no wicking mechanism is required for continuous operation. This is accomplished by utilizing surface properties of the internal vapor-liquid interface to provide a continuous liquid circulation path between the source of heat and the point of heat rejection.

A micro bellows capsule container is not completely filled with liquid thereby giving rise to the formation of a vapor bubble. The coolant vapor phase bubble is centered within the containment vessel. The unique centering of the vapor bubble is due to the surface energy characteristics of the fluid. Since the vapor bubble configuration within the closed system is stable, liquid condensate recirculation is independent of orientation with respect to the direction of external forces, such as gravity.

Heat input at the evaporation section of the capsule results in nucleate boiling or evaporation of the liquid at the liquid-vapor interface. The vapor flows across the bubble and condenses on the opposite side where heat is rejected and liquid is replenished to the evaporator section by flow through the continuous liquid film. Variations in the equilibrium operating condition of the device and bubble sizes can be obtained by selecting the appropriate working fluid. Since the device contains only the liquid and its vapor in equilibrium, the operating pressure will be determined by the vapor pressure-temperature relationship of the selected fluid. Therefore, fluids with relatively flat vapor pressure-temperature characteristics are desirable for those applications where minimum changes in pressure are desirable and vice versa.

The self-containment characteristics of the thermo capsule permits its application where direct contact with a working fluid is not permissible and it provides a highly efficient heat transfer device which takes advantage of the enthalpy of vaporization/condensation. Significant amounts of heat can be released or absorbed at high heat rates without appreciable differences in temperature. The capsule can be applied to many technologies, such as cooling electronic components, isothermal electronic switches, and de-icing of micro miniature structures.

Another advantage of the thermo capsule is that its design permits one continuous operating regime independent of working pressure, temperature, and external forces over a wide range of these conditions. The operating regime, namely, the continuous liquid circulation path, is stable and therefore provides one mode of liquid recirculation.

Accordingly, a primary object of the present invention is to provide a novel and improved heat transfer device which comprises a micro bellows thermo capsule.

Another object of the present invention is to provide a novel and improved heat transfer device comprising a micro bellows thermo capsule which is independent of orientation and requires no wicking mechanism.

A further object of the present invention is to provide a thermo capsule heat transfer device having a liquid-vapor phase interrelationship whereby a stable vapor bubble is centered within the capsule.

A still further object of the present invention is to provide a thermo capsule heat transfer device where heat input results in evaporation of liquid at a liquid-vapor bubble interface with vapor flowing across the bubble and condensing on the opposite side where heat is rejected and liquid is replenished by flow through a continuous liquid film.

A further object of the present invention is to provide a thermo capsule heat transfer device which permits one continuous operating regime independent of working pressure, temperature, and external forces over a wide range of these conditions.

Still another object of the present invention is to provide a novel and improved micro bellows thermo capsule for use in cooling intergrated circuit modules.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
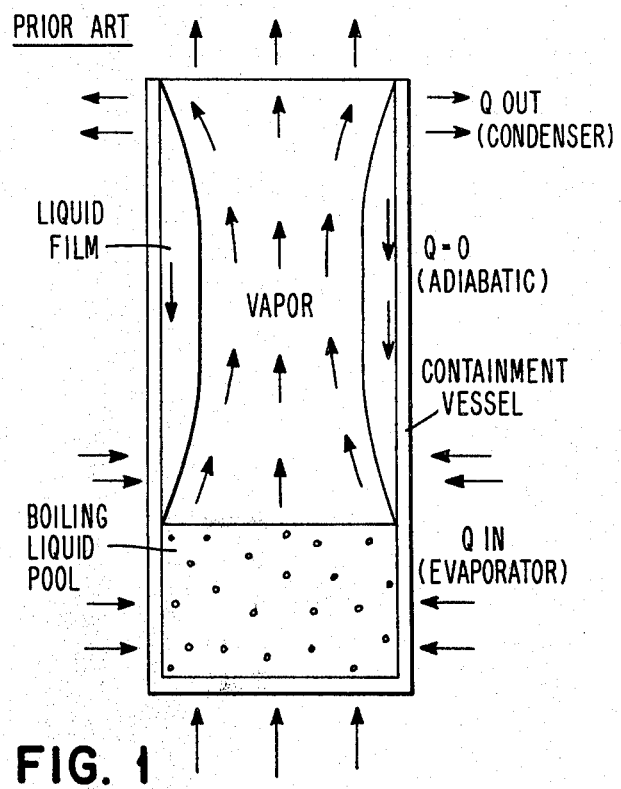
FIG. 1 illustrates the operation of the prior art thermosiphon heat transfer device.
Figure 2:
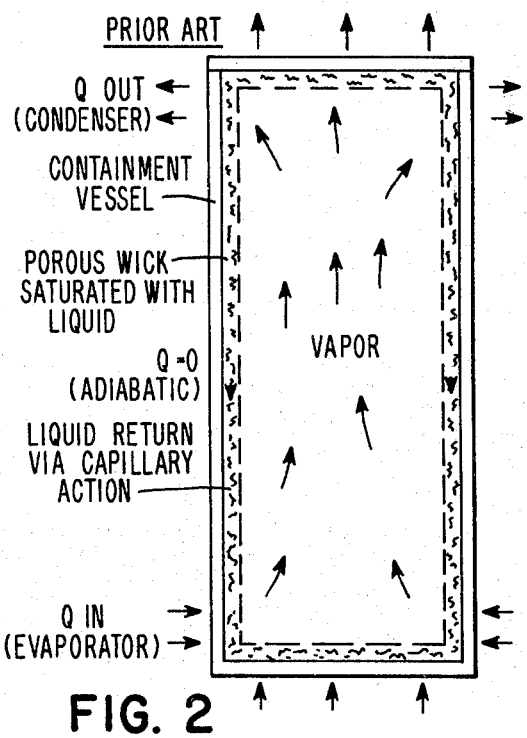
FIG. 2 illustrates the operation of the prior art heat pipe heat transfer device.

Referring first to FIGS. 1 and 2, there is illustrated two recent prior art techniques which have been involved in the cooling of electronic circuit elements. FIG. 1 shows a thermosiphon wherein a sealed containment vessel is provided with a liquid pool in an evaporator section and heat input to this section boils the liquid resulting in vapor which condenses in a condenser section where heat is rejected. The siphon relies on external forces, such as gravity, to return the condensate as a liquid film vertically along the side walls to the evaporator section. FIG. 2 illustrates the conventional heat pipe which also employs a sealed containment vessel having a liquid saturated wick structure and heat input to an evaporator section results in surface evaporation from the wick structure and vapor condenses in a condenser section where heat is rejected. The heat pipe uses the capillary forces of the internal porous wick structure to recirculate condensate to the evaporator section.

Referring now to FIGS. 3a–3d, there is illustrated the basic concept and operation of the thermo capsule heat transfer device of the present invention which makes use of a stable centered vapor bubble to provide for continuous recirculation of a liquid coolant. FIGS. 3a–3d have been exaggerated to more clearly show the formation of the vapor bubble.

Figure 3A:
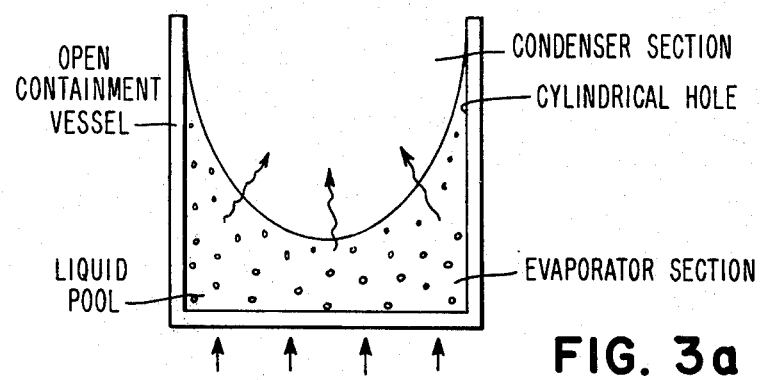
FIGS. 3a–3d illustrate the formation and operation of the heat transfer device of the present invention.

As shown in FIG. 3a, a containment vessel of solid material, such as copper, for example, is provided with a cylindrical hole which is open at the top and which has been provided with a liquid coolant pool in the bottom or evaporator section of the hole. It was found that a stable bubble could be obtained by using fluids such as ethanol, water, acetone, and 2-propanol with containers whose major dimensions varied from 0.050" to 0.300" and the length of the cylindrical hole being approximately equal to its diameter. The upper limit size of the container is determined by the surface tension characteristic of the fluid used. It is important that all air or non-condensible gases be removed from the container in order for a vapor bubble to form. One technique that may be used is to fill the container with the liquid coolant and apply heat to cause evaporation until the desired amount of liquid remains and then cap sealing the container. Heat can be applied until the temperature rises to approximately 10° F. below the boiling point of the liquid which is close to the saturation point at atmospheric pressure and will drive out air and noncondensible gases. The evaporation may be timed or the device weighed as evaporation takes place. Another technique would be to use a conventional vacuum pump and valve arrangement.

Figure 3B:
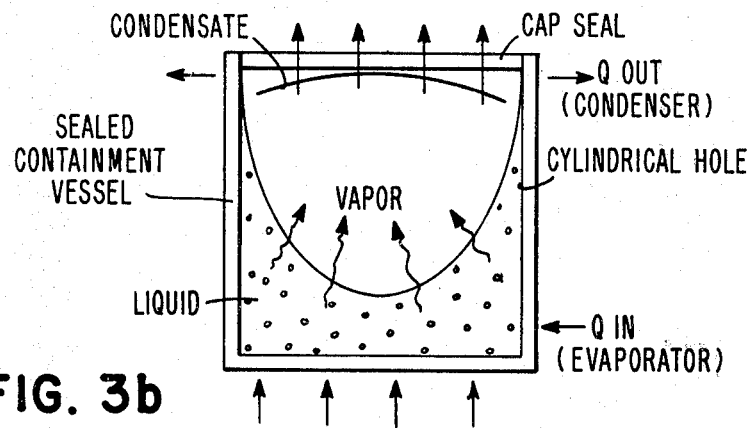

Referring to FIG. 3b, heat Q, which is to be transferred, is applied to the evaporator section of the container, which has been cap sealed at the top, causing evaporation of the liquid. Vapor will rise and condense on the undersurface of the top of the container.

Figure 3C:
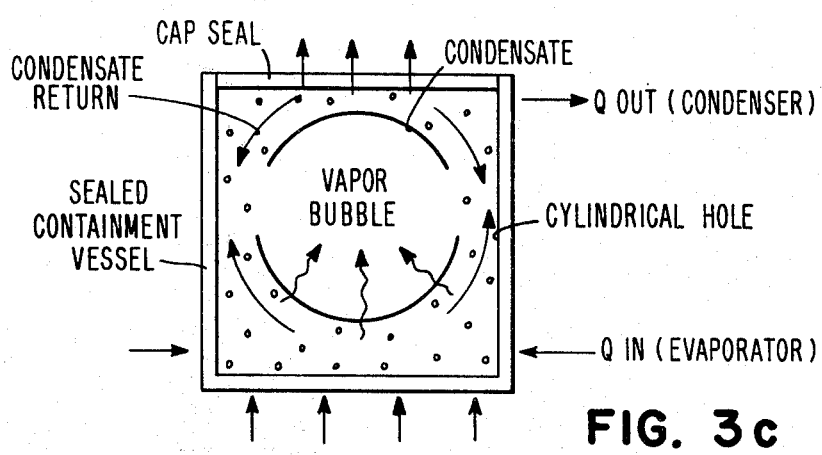

In the next stage shown in FIG. 3c, heat Q to be transferred is continuously being applied to the evaporator section. Referring to the directional arrows shown in FIG. 3c, as vapor continues to rise forming condensate, the condensate starts flowing down the sides of the container. When it contacts the liquid pool in the evaporator section, a vapor bubble is formed, but the bubble is not as yet in a stable state. Now, surface tension of the liquid causes the liquid to be redistributed and liquid will flow from the pool up around the bubble. The vapor bubble is pulled down to replace the liquid volume flowing up from the pool and the vapor bubble becomes stabilized substantially in the center of the container.

Figure 3D:
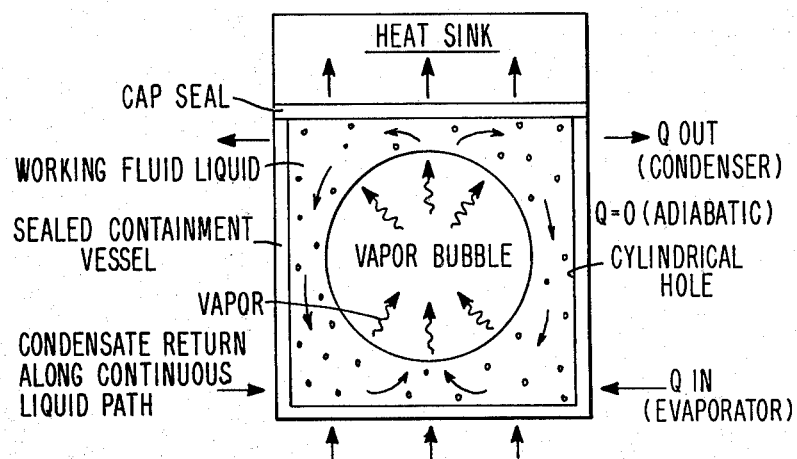

Referring now to FIG. 3d, there is shown the final operating stage of the thermo capsule. The vapor bubble takes the form of a sphere which is the most stable configuration for a stationary bubble or droplet. In the operation of the device, heat input at the evaporator section results in nucleate boiling or evaporation of the liquid at the liquid-vapor interface. As shown by the directional arrows, the vapor flows across the bubble and condenses on the opposite side where heat is rejected. Liquid is replenished to the evaporator section by condensate return flow through the continuous liquid film. The heat may be rejected to a suitable heat sink such as, for example, a conduit of flowing air. Variations in the equilibrium operating condition of the device and bubble sizes can be obtained by selecting the appropriate working fluid. Since the device contains only the liquid and its vapor in equilibrium, the operating pressure will be determined by the vapor pressure-temperature relationship of the selected fluid. therefore, fluids with relatively flat vapor pressure-temperature characteristics are desirable for those applications where minimum changes in pressure are desirable and vice vera. For example, Freon-113, trade name of E. I. du Pont de Nemours & Co., has a vapor pressure differential with respect to temperature of 15.2 mm of mercury per each rise of a degree centigrade, whereas with 1.2-ethanediol, it is 0.25 mm of mercury per each rise of a degree centigrade in temperature in the range of 50° C.–90° C. Therefore, nearly isobaric or isothermal conditions can be affected for specific applications. Since the vapor bubble configuration within the closed system is stable, liquid condensate recirculation is independent of orientation with respect to the direction of gravitational forces and also no costly internal wick structure is required.

The advantage of the stable vapor bubble arises from a unique occurrence within the thermo capsule container as the dimensions are reduced to the radius of curvature of the fluid surface. Below this distance, surface tension forces cause an involution of the surface generating a vapor bubble in the center of the system.

Therefore, a thermo capsule can also be constructed with dimensions far smaller than the fluid involution radius for a wide range of micro miniature application. As shown in FIG. 3a, the meniscus of the liquid pool should preferably be concave in configuration to enhance the formation of a vapor bubble. The meniscus configuration is determined by the force between the coolant fluid and the material of the containment vessel. The surface tension of the liquids and the container material set forth will produce the desired concave curved upper surface of the coolant liquid column since the container walls are wetted by the coolant liquid in the above-described filling method.

An example of one application where the above-described thermo capsule concept can be advantageously used is in the internal thermal enhancement of metallized ceramic and multilayer ceramic modules which contain at least one integrated circuit chip which is attached to the ceramic substrate by the use of solder joints. Conventional modules which are not provided with thermal enhancement are cooled by conducting heat from the chip, through the solder joints and into the substrate, module cap, input/output pins, and the printed circuit card or board into which the module is plugged. A common internal enhancement technique provides a parallel path directly from the chip to the module cover, thus increasing the power dissipation capability of the component. A prerequisite for this type of enhancement is that the secondary path must be flexible in order to minimize the force exerted on the chip and solder joints which arises due to tolerance buildup on the chip, substrate, and cap assembly.

Figure 4:
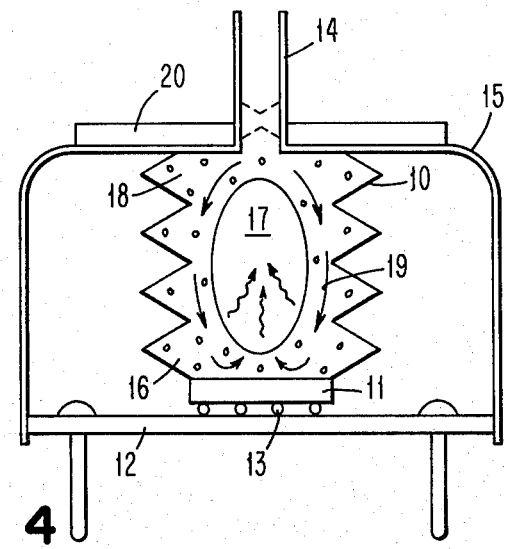
FIG. 4 illustrates the application of the present invention as a micro bellows thermo capsule for cooling an electronic device.

Referring to FIG. 4, there is illustrated the thermo capsule concept of the present invention incorporated into a micro bellows capsule 10 which is particularly adapted for use in the cooling of an integrated circuit chip 11 which is attached to the substrate 12 of a module by way of solder joints 13. The micro bellows capsule or container 10 enables the absorption of stresses in the system during operation and provides a metallurgical bond to the device and cap which is independent of the tolerances of the total system. Also, the high heat transfer rates normally associated with evaporation and condensation processes is by this means inserted within the structure of the module. The micro bellows is available on the market and by its construction it provides a hermetic environment which prevents leakage of coolant or the entry of contamination which preserves the desired equilibrium conditions. The capsule can also be bonded by a metallic interface of solder to a solderable surface on the inside of the module cap and on the backside of the chip. Since the backside of the chip can be passivated, no electrical continuity with the cap is made and an excellent thermal joint can be attained.

As shown, the bellows capsule 10 is preferably cylindrical with a cylindrical containment hole and is preferably constructed with a filling tube 14 at one end which may be made of a soft material, such as copper, and which is used to insert the liquid coolant after module assembly. In the bonding and assembly of the micro bellows capsule into the module, a solderable metal, such as gold, is evaporated on the backside of the chip 11 during fabrication of the wafer from which the chip is diced. A passivation layer of silicon oxide is incorporated before the metal evaporation to assure electrical isolation.

The micro bellows is constructed of a solderable metal, such as nickel or copper, and the inside of the module cap 15 can be electroless/electrolytically deposited with copper. A solder bond or gold-tin eutectic is then utilized to join the bellows capsule between the inside of the cap and the backside of the chip. Joining is done in a chip joining furnace similar to those used in the conventional chip joining technology.

After assembly, a hypodermic syringe can be used to completely fill the bellows capsule container with a liquid coolant. Heat is then applied to the evaporator section 16 such that the fluid temperature is raised to 10° F. below its boiling point allowing the coolant to evaporate out the open filler tube until the coolant reaches approximately one-third of the original volume and a vapor bubble begins to form.

Now the filler tube is sealed by compression, such as crimping. Thus, at this point the bellows capsule is closed and now the capsule is in the same state as the container illustrated in FIG. 3c.

Now when the module is put into operation, heat from the circuit chip 11 will cause the liquid coolant in the evaporator section of the capsule to evaporate and the same action occurs as was described in connection with FIG. 3d. The stable vapor bubble 17 is formed substantially in the center of the capsule and vapor flows across the bubble and condenses in a condenser section 18 on the other side where heat is rejected. Liquid is replenished to the evaporator section by condensate return flow 19 through the continuous liquid film. A suitable heat sink 20 may be attached to the top of the module cap. The heat sink may comprise water, air flow, thermal grease, or the like.

In the operation of the module, the circuit chip heat dissipation occurs at junctions within the chip. In present day technology, as the junction temperature increases the chip life will be degraded. In using the present thermo bellows capsule, by selecting the appropriate coolant vapor-pressure characteristics and fill quantity, the junction temperature can be regulated well below present day operating temperatures to give the minimum solder joint to substrate expansion excursion which in turn enhances the life of the solder joints. Also, by selecting the operating pressure, the solder joints can by design be placed in tension or compression which is also considered as a means of enhancing solder joint life.

With the present capsule application, the composition of the container permits a soldered or eutectic metallurgical bond to both the cap and chip of approximately 0.002 inch thickness which results in a very low thermal resistance joint. Assuming a 0.002 inch solder thickness for the bond from the chip to the thermo capsule and from the thermo capsule to the module cap and that the thermo capsule containment vessel has 0.015" thick copper ends, the table below illustrates that an order of magnitude reduction in internal resistance, $R_{INt}$, (degrees centigrade per watt) is possible with reference to a standard metallized ceramic product, Std. Mod., which has no thermal enhancement and that a four-fold reduction is possible with reference to a module having a heat sink of thermal grease, W/Grease, with 0.350" chip size.

| Square Chip Size | No. of Solder Joints | Typical Thermal Characteristics $R_{Int}$ °C./Watt | | |
|---|---|---|---|---|
| | | Std. Mod. | W/Grease | W/Thermo Capsule |
| .160" | 48 | 20.6 | 6.0 | 2.8 |

-continued

| | | Typical Thermal Characteristics | | |
|---|---|---|---|---|
| Square Chip Size | No. of Solder Joints | $R_{Int}$ °C./Watt | | |
| | | Std. Mod. | W/Grease | W/Thermo Capsule |
| .237" | 82 | 13.1 | 4.5 | 1.2 |
| .350" | 130 | 8.9 | 2.3 | 0.6 |

The thermo capsule concept can be introduced to current module technologies with minimal or no impact to module design and the bonding operation is accomplished by using conventional process technology. If necessary, convenient rework is premitted. By heating in a pressurized nitrogen atmosphere to the bonding temperature, the cap and the micro bellows can be removed.

While the invention has been particularly shown and described with reference to a preferred embodiment thereof, it will be understood by those skilled in the art that various changes in form and details may be made therein without departing from the spirit and scope of the invention.

Having thus described our invention, what we claim as new, and desire to secure by Letters Patent is:

1. A heat transfer device comprising;
a closed container having an evaporator section and a condenser section; and
a liquid coolant in said evaporator section having surface tension characteristics whereby the application of heat to said evaporator section results in the formation of a vapor bubble and a flow of vapor across said bubble which condenses in said condenser section where heat is rejected and liquid is replenished to said evaporator section by flow through a continuous liquid film.

2. A heat transfer device comprising;
a closed micro container having a cylindrical containment hole;
an evaporator section and condenser section in said containment hole; and
a liquid coolant in said evaporator section having surface tension characteristics whereby the application of heat to said evaporator section results in the formation of a vapor bubble and a flow of vapor across said bubble which condenses in said condenser section where heat is rejected and liquid is replenished to said evaporator section by flow through a continuous liquid film.

3. A heat transfer device as set forth in claim 2 wherein said liquid coolant has a concave meniscus.

4. A heat transfer device comprising;
a closed micro container having a cylindrical containment hole which has a length approximately equal to its internal diameter;
an evaporator section and condenser section in said containment hole; and
a liquid coolant in said evaporator section having surface tension characteristics and a concave meniscus whereby the application of heat to said evaporator section results in the formation of a stable vapor bubble substantially in the center of said containment hole and a flow of vapor across said bubble which condenses in said condenser section where heat is rejected and liquid is replenished to said evaporator section by flow through a continuous liquid film.

5. A heat transfer device as set forth in claim 4 wherein said container is a micro bellows capsule.

6. A heat transfer device comprising;
a closed thermo micro capsule container having a cylindrical containment hole which has a length approximately equal to its internal diameter;
an evaporator section and condenser section in said containment hole; and
a liquid coolant pool in said evaporator section having a concave meniscus, said capsule container having dimensions reduced to the radius of curvature of the liquid surface whereby below this distance the application of heat to said evaporator section results in surface tension forces causing an involution of the liquid surface which generates a stable vapor bubble substantially in the center of said containment hole and a flow of vapor across said bubble which condenses in said condenser section where heat is rejected and replenished to said evaporator section by flow through a continuous liquid film.

7. A heat transfer device as set forth in claim 6 wherein said liquid coolant pool occupies approximately one-third the volume of said containment hole.

8. A heat transfer device for use in a module having an integrated circuit chip contained within a module cap which comprises;
a closed micro bellows capsule having a cylindrical containment hole;
an evaporator section at one end of said containment hole and a condenser section at the opposite end;
means attaching said evaporator section end to said circuit chip and said condenser section end to said module cap; and
a liquid coolant pool in said evaporator section having surface tension characteristics and a concave meniscus whereby the application of heat from said circuit chip to the evaporator section results in the formation of a stable vapor bubble substantially in the center of said containment hole and a flow of vapor across said bubble which condenses in said condenser section where heat is rejected and liquid is replenished to said evaporator section by flow through a continuous liquid film.

9. A heat transfer device as set forth in claim 8 wherein said micro bellows capsule is constructed of a solderable material; and
said liquid coolant comprises an alcohol.

* * * * *